(12) United States Patent
Tsubata et al.

(10) Patent No.: US 6,437,368 B2
(45) Date of Patent: Aug. 20, 2002

(54) THIN FILM TRANSISTOR

(75) Inventors: Toshihide Tsubata; Junichi Hiraki, both of Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/784,062

(22) Filed: Feb. 16, 2001

(30) Foreign Application Priority Data

Feb. 18, 2000 (JP) ........................................ 2000-041911
Dec. 26, 2000 (JP) ........................................ 2000-395829

(51) Int. Cl.[7] .............................................. H01L 29/04
(52) U.S. Cl. ........................ 257/59; 257/52; 257/57; 257/58; 257/61; 257/64
(58) Field of Search .......................... 257/52, 57, 58, 257/59, 61, 64

(56) References Cited

U.S. PATENT DOCUMENTS

| | | | | |
|---|---|---|---|---|
| 5,132,745 A | * | 7/1992 | Kwasnick et al. | 357/4 |
| 5,289,016 A | * | 2/1994 | Noguchi | 257/57 |
| 5,561,074 A | | 10/1996 | Koide et al. | 437/40 |
| 5,917,199 A | * | 6/1999 | Byun et al. | 257/59 |
| 5,953,583 A | | 9/1999 | Ban et al. | 438/30 |
| 6,011,274 A | * | 1/2000 | Gu et al. | 257/59 |
| 6,285,041 B1 | * | 9/2001 | Noguchi | 257/61 |

* cited by examiner

*Primary Examiner*—Jerome Jackson, Jr.
*Assistant Examiner*—N. Drew Richards

(57) ABSTRACT

An Ta film for use in forming a source electrode and a drain electrode and an amorphous silicon film for use in forming an amorphous silicon semiconductor layer with impurity are continuously etched without setting an etching selectivity ratio. As a result, the source electrode, the drain electrode and the amorphous silicon semiconductor can be formed by a single etching process, and in the meantime, surface protrusions and recessions can be formed in a back channel region on the order of several hundreds of Å reflecting the crystal grain diameters of the Ta film for use in forming the source electrode and the drain electrode. The resulting protrusions and recessions offers an effect of suppressing an increase in OFF-state current value of the thin film transistor, and according to the foregoing method, the thin film transistor can be manufactured through a reduced number of steps at lower cost.

8 Claims, 8 Drawing Sheets

THIN FILM TRANSISTOR

FIELD OF THE INVENTION

The present invention generally relates to a thin film transistor, and particularly relates to a thin film transistor including a semiconductor film made of amorphous silicon (a-Si).

BACKGROUND OF THE INVENTION

Recently, for their superior characteristics as to compact size, thinness, low power consumption, light weight, etc., liquid crystal display devices have been used in variety of electric apparatuses. Particularly, active-matrix-type liquid crystal display devices adopting switching elements as active elements which offer equivalent display characteristics to those of CRT (Cathode Ray Tube) have been widely used in OA apparatuses such as personal computers, or AV apparatuses such as portable televisions, or the like. An example structure of such active-matrix-type liquid crystal devices will be explained in details in reference to FIG. 6.

FIG. 6 is a cross sectional view schematically illustrating the typical structure of the active-matrix-type liquid crystal display device. The active-matrix-type liquid crystal display device includes a TFT (Thin Film Transistor) substrate 101 and a counter substrate 102 which are connected so as to face one another, and liquid crystal 103 sealed in a space between the TFT substrate 101 and the counter substrate 102.

The TFT substrate 101 includes a transparent insulating substrate 104, and a gate electrode 105, a source bus line (not shown), a TFT (not shown) and a pixel electrode 106 connected to the TFT which are formed on the surface of the transparent insulating substrate 104 on the side of the liquid crystal 103, and further includes an alignment film 107 formed so as to cover the entire surface of the transparent insulating substrate 104 including these members. The surface of this alignment film 107 is rubbing processed.

On the other hand, the counter substrate 102 includes a transparent insulating substrate 108, and a transparent electrode 109 and an alignment film 110 which are formed in this order on a color filter (not shown) disposed on the surface of the transparent insulating substrate 108 on the side of the liquid crystal 103. The surface of this alignment film 110 is rubbing processed. In FIG. 6, reference numerals 111 and 112 indicate polarizing plates.

The structure of a conventional TFT adopted in the active-matrix-type liquid crystal display device will be explained in details in reference to FIGS. 7 and 8. FIG. 7 is a plan view illustrating a layout per pixel of the TFT substrate 101, while FIG. 8 illustrates a cross section of the portion along an arrow line B—B in FIG. 8.

As illustrated in FIG. 7, the TFT substrate 101 includes gate bus lines 113 and source bus lines 114 arranged in a matrix form. Further, a gate electrode 105 and a source electrode 115 are formed as branches of the gate bus line 113 and the source bus line 114 respectively for each pixel.

Next, the concrete structure of the TFT will be explained while explaining the manufacturing steps thereof in reference to FIG. 8.

First, the gate electrode 105 is formed on the transparent insulating substrate 104, and thereafter, a gate insulating film 116 is formed thereon so as to cover the gate electrode 105. Then, on this gate insulating film 116, an amorphous silicon semiconductor layer 117 without impurity and an amorphous silicon semiconductor layer 118 with impurity are patterned in a shape of island. Further, the source electrode 115 and the drain electrode 119 are formed by etching by setting an etching selectivity ratio to the amorphous silicon semiconductor layer 118 with impurity (the amorphous silicon semiconductor layer 118 is not etched completely). Then, this amorphous silicon semiconductor layer 118 with impurity is subjected to etching to form a source/drain separated portion, and further the pixel electrode 106 is formed by the transparent electrode. Thereafter, the entire surface of the TFT substrate 101 is covered with an protective film 120.

Hereinafter, a path for flowing therethrough an OFF-state current (to be described later) formed on the surface or the interface of the amorphous silicon semiconductor layer 117 without impurity at a portion (source/drain separated portion) between the source electrode 115 and the drain electrode 119 is referred to as a back channel.

However, for the thin film transistor manufactured by the foregoing conventional method, the following problem remains unsolved. That is, in the state an electric field induced by the externally applied positive charges due to the surface contaminations or by the positive charges of the protective film itself becomes not less than the threshold level of the back channel, the OFF-state current value of the TFT (leak current value in the OFF state) increases due to the back channel effects. The ratio of the ON-state current to the OFF-state current of the TFT determines the contrast of the display device which greatly affects the display quality. Further, the described phenomenon of increasing the OFF-state current value of the TFT due to the back channel effects is induced by driving the thin film transistor over a long period of time, and the foregoing problem of an increase in the OFF-state current is serious as it affects the reliability of the product.

Here, the back channel effects are defined to be a phenomenon in which electrons are induced in the back channel by the externally applied positive charges due to the surface contaminations or by the positive charges of the protective film itself.

Here, as a solution to the above problem, for example, Japanese Unexamined Patent Publication No. 8440/1996 (Tokukaihei 8-8440 published on Jan. 12, 1996) discloses a structure wherein a p-type amorphous silicon layer is formed between the amorphous silicon semiconductor layer and the protective film in the back channel region so as to prevent an increase in OFF-state current value caused by electrons induced in the back channel.

However, according to the structure of the thin film transistor disclosed in Japanese Unexamined Patent Publication No. 8440/1996, a problem arises in that for the formation of this p-type amorphous silicon layer, the required number of steps for manufacturing the thin film transistor increases, resulting in an increase in manufacturing cost.

According to the foregoing conventional method, it is therefore not possible to provide the thin film transistor which realizes a further reduction in OFF-state current and which can be manufactured at lower cost through a smaller number of steps.

SUMMARY OF THE INVENTION

It is an object of the present invention to provide a thin film transistor which realizes a further reduction in OFF-state current and which can be manufactured at lower cost through a smaller number of steps.

In order to attain the foregoing object, a thin film transistor of the present invention is arranged so as to include:

a gate electrode provided on a transparent insulating substrate;

a first semiconductor layer formed on the gate electrode via a gate insulating film; and a source electrode and a drain electrode formed on the first semiconductor layer via a second semiconductor layer which functions as a contact layer, wherein protrusions and recessions are formed in a separated portion between the source electrode and the drain electrode on a surface of the first semiconductor layer.

Here, the surface of the first semiconductor layer between the source electrode and the drain electrode is referred to as a back channel region (a region where a back channel is formed).

In the foregoing structure, the non-bonded area where bonds are cut is increased in the back channel region by the surface protrusions and recessions formed in the source/drain separated portion on the surface (back channel region) of the first semiconductor layer, and the number of uncombined bonds increases consequently. Accordingly, defects which trap carriers increase in the back channel region, and the effect of bending a band can be suppressed, and whereby a threshold value of the back channel can be increased. In the state where an electric field induced by the externally applied positive charges due to the surface contaminations or by the positive charges of the protective film itself becomes not less than the threshold level, the OFF-state current value of the TFT increases. It is therefore possible to reduce an OFF-state current value by increasing the threshold value of the back channel as in the foregoing structure of the present invention.

Furthermore, by suppressing an increase in OFF-state current value, such problem that the final product becomes less reliable due to a reduction in contrast over a long time driving of a panel can be more surely prevented.

For a fuller understanding of the nature and advantages of the invention, reference should be made to the ensuing detailed description taken in conjunction with the accompanying drawings.

DESCRIPTION OF THE PREFERRED EMBODIMENTS

The following descriptions will explain one embodiment of the present invention, while referring to FIGS. 1 through 6.

Figure 1:
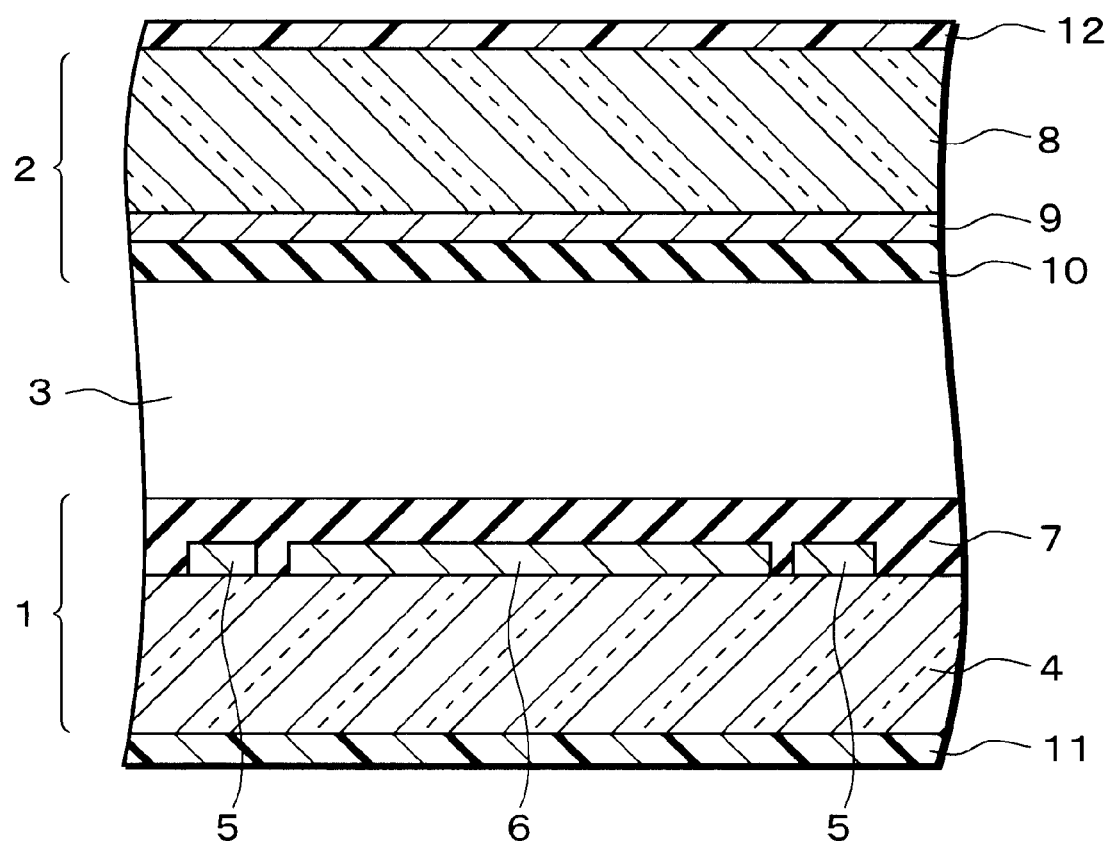
FIG. 1 is a cross-sectional view schematically illustrating the structure of an active-matrix-type liquid crystal display device adopting a thin film transistor (TFT) in accordance with one embodiment of the present invention.

FIG. 1 is a cross sectional view schematically illustrating the structure of an active-matrix-type liquid crystal display device adopting a thin film transistor (hereinafter referred to as TFT (Thin Film Transistor)) of the present embodiment. The active-matrix-type liquid crystal display device includes a TFT substrate 1 and a counter substrate 2 which are connected so as to face one another, and liquid crystal 3 sealed in a space formed between the TFT substrate 1 and the counter substrate 2.

The TFT substrate 1 includes a transparent insulating substrate 4, and a gate electrode 5, a source bus-line (not shown), a TFT (not shown), and a pixel electrode 6 connected to the TFT which are formed on the surface of the transparent insulating substrate 4 on the side of the liquid crystal 3, and further includes an alignment film 7 formed so as to cover the entire surfaces of the above members. The surface of this alignment film 7 is rubbing processed.

On the other hand, the counter substrate 2 includes a transparent insulating substrate 8, and a transparent electrode 9 and an alignment film 10 which are formed in this order on a color filter (not shown) formed on the surface of the transparent insulating substrate 8 on the side of the liquid crystal 3. This alignment film 10 is rubbing processed. In FIG. 1, reference numerals 11 and 12 indicate polarizing plates.

Figure 2:
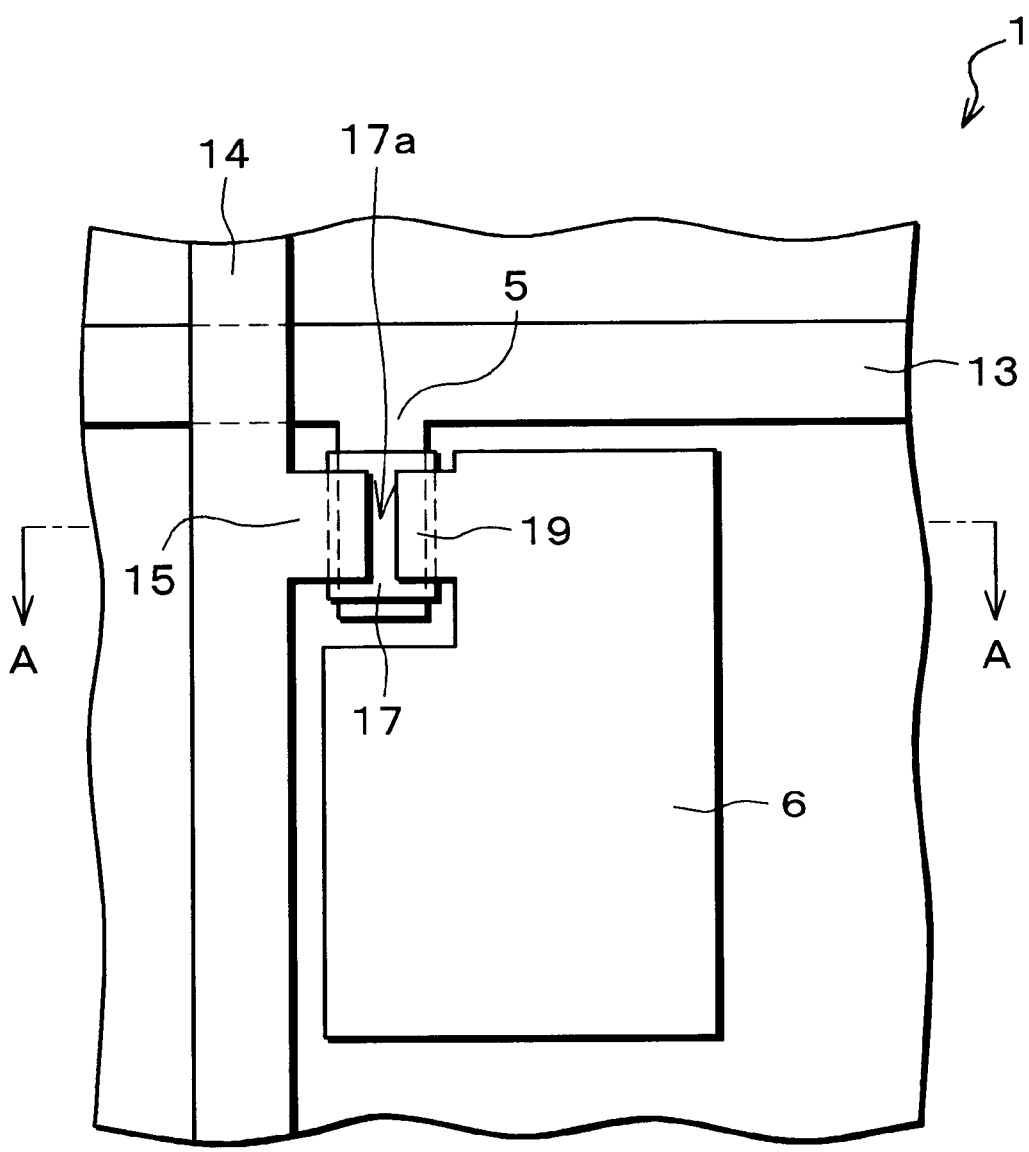
FIG. 2 is a plan view illustrating one pixel portion of the active-matrix-type liquid crystal display device of FIG. 1.
Figure 3:
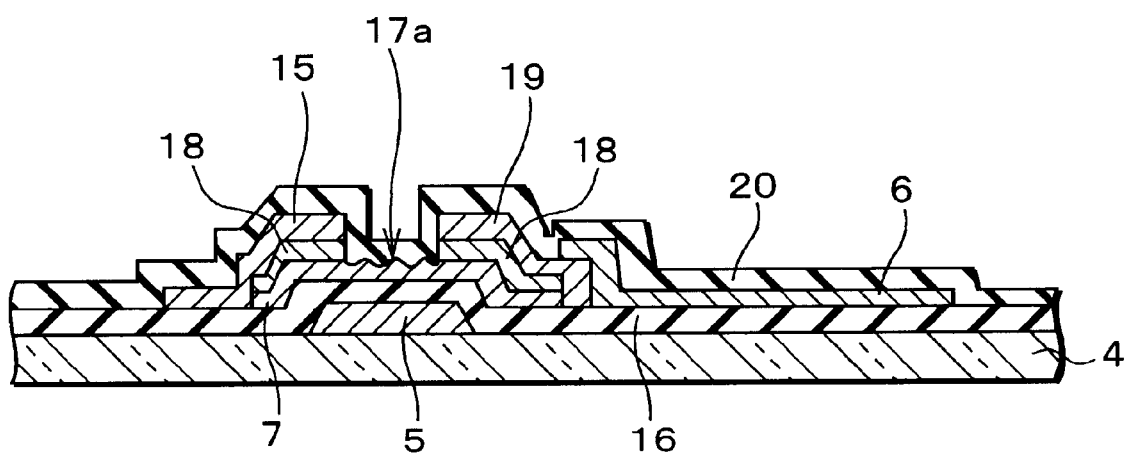
FIG. 3 is a cross-sectional view of the portion along an A—A arrow line in FIG. 2.

The structure of the TFT of the present embodiment adopted in the active-matrix-type liquid crystal display device will be explained in details in reference to FIGS. 2 and 3. FIG. 2 is a plan view illustrating a layout per pixel of the TFT substrate 1, while FIG. 3 illustrates a cross section of the portion along an arrow line A—A in FIG. 2.

As illustrated in FIG. 2, the TFT substrate 1 includes gate bus lines 13 and source bus lines 14 arranged in a matrix form. The TFT substrate 1 further includes a gate electrode 5 and a source electrode 15 formed as branches of the gate bus line 13 and the source bus line 14 respectively for each pixel.

Next, detailed structure of the TFT provided on the TFT substrate 1 will be explained also in reference to the cross sectional view of FIG. 3.

On the transparent insulating substrate 4, the gate electrode 5 is formed, and further a gate insulating film 16 is formed so as to cover the entire surface of the transparent insulating substrate 4 including the gate electrode 5. Above the gate electrode 5, an amorphous silicon semiconductor layer 17 without impurity (first semiconductor layer) is formed via the gate insulating film 16. Further, on this amorphous silicon semiconductor layer 17, a source electrode 15 and a drain electrode 19 are formed via an amorphous silicon semiconductor layer 18 with impurity (second semiconductor layer). On the surface 17a of the amorphous silicon semiconductor layer 17 between the source electrode 15 and the drain electrode 19 (hereinafter referred to as a source/drain separated portion), surface protrusions and recessions are formed on the order of several hundreds of Å RMS (Root Mean Square).

Hereinafter, the surface of the amorphous silicon semiconductor layer 17 between the source electrode 15 and the drain electrode 19 is referred to as a back channel region (a region in which back channel is formed). As will be explained in details later, the surface protrusions and recessions formed in the back channel region are formed reflecting the crystal grain diameters of the metal film for use in forming the source electrode 15 and the drain electrode 19. The functions and effects of the surface protrusions and recessions will be explained in details later.

Further, the pixel electrode 6 composed of a transparent electrode is arranged so as to be connected to the drain electrode 19, and the entire surface of the TFT substrate 1 is covered with a protective film 20.

Figure 4:
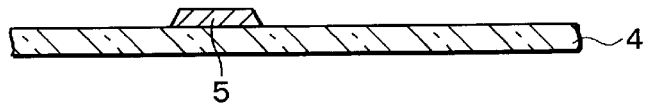
FIGS. 4(a) through 4(d) are explanatory views illustrating manufacturing processes of the TFT.
Figure 4:
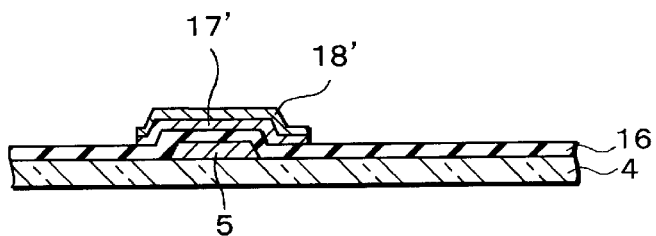
Figure 4:
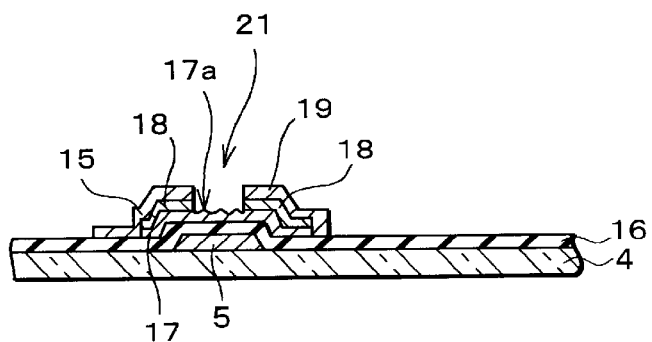
Figure 4:
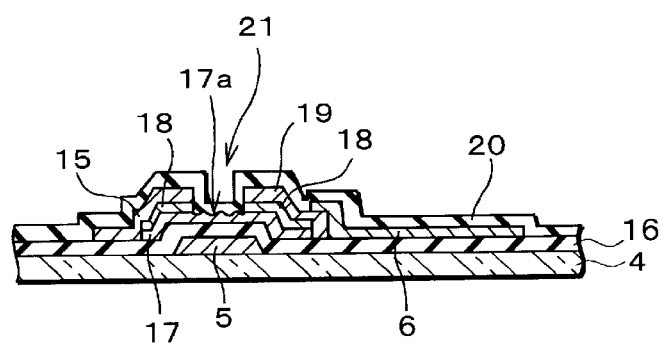
Figure 5:
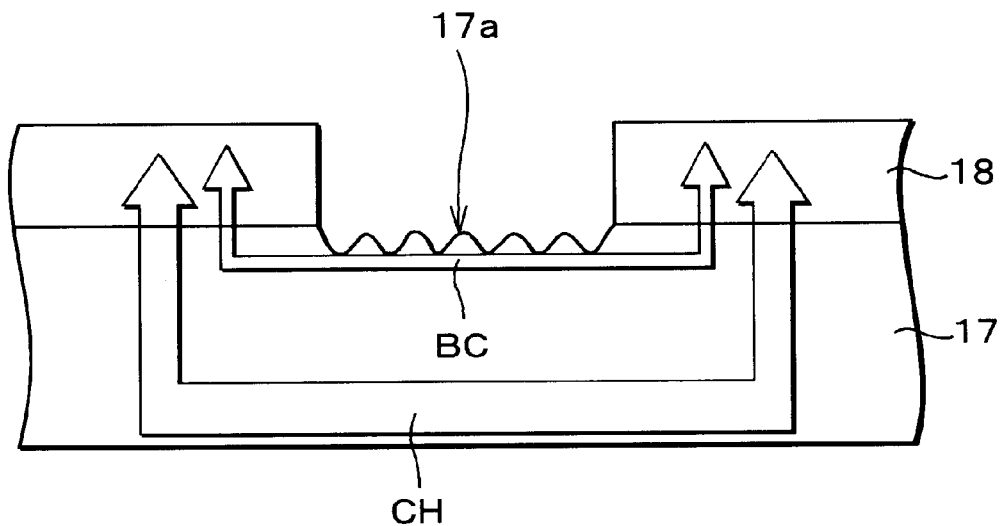
FIG. 5(a) is an explanatory view which explains an OFF-state current induced by the back channel effect of the TFT.
FIG. 5(b) is an explanatory view which explains the mechanism of forming protrusions and recessions in a back channel region, reflecting the crystal grain diameters of a metal film for use in forming a source electrode and a drain electrode.
Figure 5:
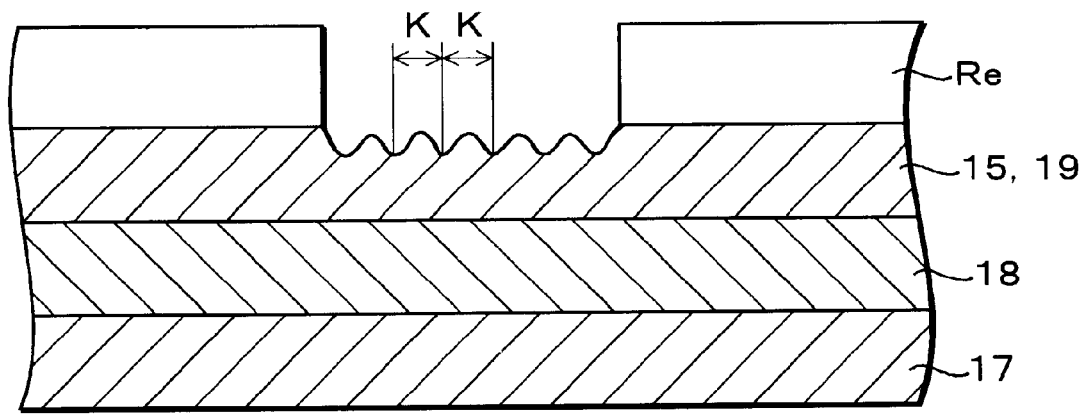

Next, in reference to FIG. 4, the manufacturing method of the TFT substrate 1 and the materials adopted in each member will be explained.

First, a Tantalum (Ta) film is formed on the transparent insulating substrate 4 made of glass, etc., and the gate electrode 5 is formed by the photolithography process and the etching process such as dry etching (see FIG. 4(a)). In the present embodiment, Ta is adopted for the material of the gate electrode 5. However, the material for the gate electrode 5 is not necessarily limited to Ta, and any metal which offers a predetermined bus line resistance such as aluminum (Al), titanium (Ti), chromium (Cr) or alloys thereof may be adopted. Also, a gate electrode 5 of a laminated structure of TiN/Ta/TaN or Ti/Al/Ti may be adopted as well.

Next, on the entire surface of the transparent insulating substrate 4 including the gate electrode 5, a gate insulating film 16 made of silicon nitride (SiN), an amorphous silicon without impurity and an amorphous silicon with impurity are formed successively by the plasma CVD (chemical vapor deposition) method. Subsequently, an amorphous silicon film 17' without impurity and an amorphous silicon film 18' with impurity are patterned in a shape of island by the photolithography process and the etching process (see FIG. 4(b)).

Next, after forming the Ta film on the amorphous silicon film 17' and the amorphous silicon film 18', patterning of the Ta film is performed to form the source electrode 15 and the drain electrode 19 by the photolithography process. Further, the Ta film for use in forming the source electrode 15 and the drain electrode 19, and the amorphous silicon film 18' for use in forming the amorphous silicon film 18, formed under the Ta film, are subjected to continuous dry etching without setting an etching selection ratio (both the Ta film and the amorphous silicon film 18' are etched completely), thereby forming the source/drain separated region 21. In this way, the formation of the amorphous silicon semiconductor layer 17 without impurity, the amorphous silicon semiconductor layer 18 with impurity, the source electrode 15 and the drain electrode 19 can be completed by the single etching process (see FIG. 4(c)).

As described, by continuously etching the Ta film for use in forming the source electrode 15 and the drain electrode 19 and the amorphous silicon film 18' for use in forming the amorphous silicon semiconductor layer 18 with impurity without setting an etching selectivity ratio (both the Ta film and the amorphous silicon film 18' are etched completely), the surface protrusions and recessions can be formed on the order of several hundreds of Å RMS reflecting the crystal grain diameters of the metal film (the Ta film in this example) for use in forming the source electrode 15 and the drain electrode 19 (as indicated by reference numeral 17a in Figures).

In the present embodiment, the Ta film is adopted for the source electrode 15 and the drain electrode 19. However, the metal film of the present invention is not necessarily limited to the Ta film, and any metals that can offer a predetermined bus line resistance such as aluminum (Al), titanium (Ti), chromium (Cr) or alloys thereof may be adopted. Also, a gate electrode 5 of a laminated structure of TiN/Ta/TaN or Ti/Al/Ti may be adopted as well. Additionally, for the source electrode 15 and the drain electrode 19, other than the generally used metal film, a transparent electrically conductive film such as ITO (indium tin oxide) or the like may be adopted.

Thereafter, the pixel electrode 6 is formed so as to be connected to the drain electrode 19, and a protective film 20 made of SiN, etc., is formed so as to cover the entire surface of the TFT substrate 1 by the plasma CVD method (see FIG. 4(d)).

Next, the functions and effects of the surface protrusions and recessions formed in the back channel region 17a will be explained in reference to FIG. 5(a).

The surface protrusions and recessions are formed in the back channel region 17a on the order of several hundreds of Å RMS reflecting the crystal grain diameters of the metal film (the Ta film in this example) for use in forming the source electrode 15 and the drain electrode 19. These surface protrusions and recessions are formed by differences in etching ratio within the metal film according to the crystal concentration. As the resulting surface protrusions and recessions increase a non-bonded area where bonds are cut in the back channel region 17a, and the number of uncombined bonds increases consequently. Accordingly, defects in the back channel region 17a increase, which in turn increases a threshold value of the back channel.

On the other hand, when the electric field induced by the externally applied positive ions due to the surface contamination of the protective film 20, etc., or the electric field induced by the positive charges of the protective film 20 itself becomes not less than the threshold value of the back channel, the OFF-state current flowing through the current path BC (see FIG. 5(a)) induced by the back channel effect increases. Therefore, by increasing the threshold value of the back channel like the case of the present invention, the OFF-state current value can be reduced. Here, CH in FIG. 5(a) indicates the ON-state current path in the ON state of the TFT.

The back channel effect indicates such phenomenon that electrons are induced in the back channel by the externally applied positive charges due to the surface contaminations or by the positive charges of the protective film itself.

Figure 8:
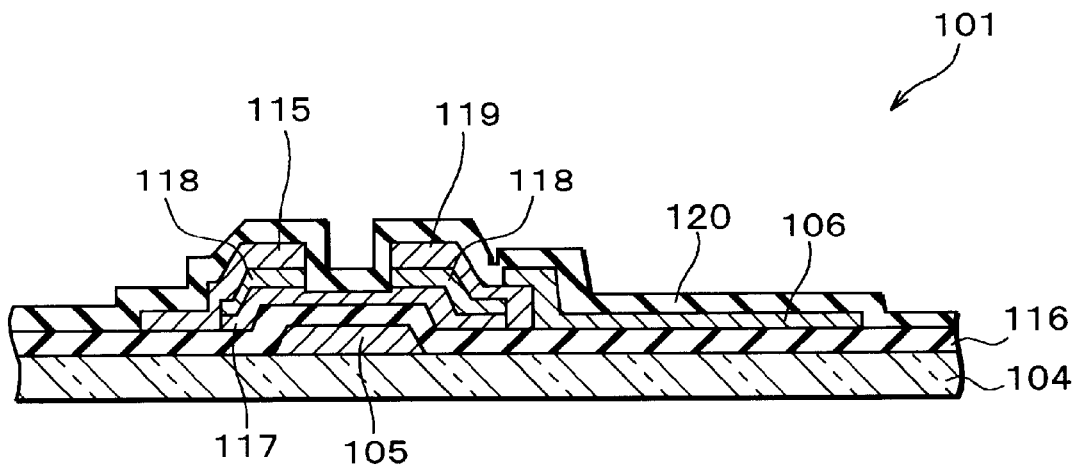
FIG. 8 is a cross-sectional view of the portion along a B—B arrow line in FIG. 7.

According to the conventional manufacturing method (see FIG. 8) wherein the source electrode 115 and the drain electrode 119 are etched by setting the etching selectivity ratio to the amorphous silicon semiconductor layer 118 with impurity (the amorphous silicon semiconductor layer 118 is not etched completely), followed by the separation etching of the amorphous silicon semiconductor layer 118 with impurity in a source/drain separated portion, the surface protrusions and recessions can be formed only on the order of several Å RMS. Therefore, it is not possible to increase defects in the back channel region to the sufficient level for suppressing the back channel effect. It is therefore difficult to reduce the OFF-state current value by the conventional method.

In contrast, according to the manufacturing method of a TFT of the present embodiment, the surface protrusions and recessions in the back channel region 17a which permits a reduction in OFF-state current value can be formed with ease without lowering the yield of the TFT substrate 1.

Moreover, these protrusions and recessions can be formed in the back channel region 17a without increasing the manufacturing cost.

According to the etching method of the present embodiment, on the surface of the amorphous silicon semiconductor layer 17 without impurity (the first semiconductor layer) between the source electrode 15 and the drain electrode 19 (back channel region), protrusions and recessions can be formed reflecting the crystal grain diameters of the metal film for use in forming the source electrode 15 and the drain electrode 19. These surface protrusions and recessions are formed, for example, by the following mechanisms.

The metal film has such characteristic that a boundary between crystal grains is liable to be etched, and for this reason, a difference occurs in etching rate between the "crystal grain boundary" and the "transcrystal". Namely, there arises differences in etching rate within the metal film according to the crystal concentration. The amorphous silicon semiconductor layer 17 is therefore etched in such a manner that recessions are formed corresponding to the grain boundary portions of the crystal grains, while the protrusions are formed corresponding to the transcrystal portions of the crystal grains as illustrated in FIG. 5(b). In FIG. 5(b), "K" corresponds to the crystal grain diameter of the metal film. Specifically, as illustrated in FIG. 5(b), in order to form the source electrode 15 and the drain electrode 19 in a separated manner, when etching the metal film using a photoresist pattern Re, the etching occurs at the boundary portion indicated by "K" prior to other portions. As a result, protrusions and recessions can be formed on the surface of the amorphous silicon semiconductor layer 17.

These protrusions and recessions on the surface of the amorphous silicon semiconductor layer 17 are preferably in size within the range of from 100 Å to 900 Å RMS, more preferably within the range of from 200 Å to 800 Å RMS.

The RMS can be defined as follows:

$$RMS = \{\Sigma(Zi-Zave)^2/N\}^{1/2}.$$

N . . . number of data points
Zi . . . Z value of each data point
Zave . . . mean of all the Z values
Z . . . height of protrusions and recessions at each point measured by a surface roughness measuring device (AFM: Atomic Force Microscope).

In general term, the RMS indicates the square root of the mean of the squares of a periodic function for one period, which is different from the standard deviation. In the present invention, however, the RMS is considered to be identical to the standard deviation for the following reasons. That is, in the case of forming the protrusions and recessions reflecting the crystal grain boundary of an ideal crystal film without variations in etching precision, the resulting surface protrusions and recessions of the semiconductor layer can be defined by a periodic function. In practice, however, a complete periodic function cannot be obtained, and thus the square root of the mean of the squares over several periods would be identical to the standard deviation.

By forming the protrusions and recessions in size within a range of from 100 Å to 900 Å RMS, the following effects can be achieved. That is, with the protrusions and recessions in size of not less than 100 Å RMS, a non-bonded area where bonds are cut can be increased in the back channel region. On the other hand, with the protrusions and recessions in size of not more than 900 Å RMS, adverse effects on the surface condition such as a reduction in adhesiveness which possibly occur when laminating thereon another film can be suppressed. Consequently, the number of uncombined bonds can be increased in the back channel region in the semiconductor element as final product. As a result, the number of defects in the back channel region increases which in turn increases the threshold value of the back channel.

Furthermore, by forming the protrusions and recessions in size within a range of from 200 Å to 800 Å RMS, the following effects can be achieved. That is, with the protrusions and recessions in size of not less than 200 Å RMS, a still larger non-bonded area where bonds are cut can be achieved in the back channel region. On the other hand, with the protrusions and recessions in size of not more than 800 Å RMS, adverse effects on the surface condition such as a reduction in adhesiveness which possibly occur when laminating thereon another film can be more suppressed. Consequently, the number of uncombined bonds can be increased in the back channel region in the semiconductor element as final product. As a result, the number of defects in the back channel region further increases which in turn further increases the threshold value of the back channel. It is therefore possible to obtain a still larger defect area in the back channel region in more desirable state as compared to the above structure having the protrusions and recessions in size within the range of from 100 Å to 900 Å RMS.

Furthermore, by suppressing an increase in OFF-state current value, such problem that the final product becomes less reliable due to a reduction in contrast over a long time driving of a panel can be more surely prevented.

Next, a concrete example of the method of manufacturing the thin film transistor of the present embodiment will be explained in reference to FIG. 4(b) and FIG. 4(c).

To begin with, the processes illustrated in FIG. 4(b) will be explained.

Firstly, amorphous silicon without impurity is formed by a plasma CVD device under the following conditions:

power . . . 500 W
pressure . . . 150 Pa
film thickness . . . 200 to 2000 Å.

The lower limit (200 Å) for the film thickness of the amorphous silicon film without impurity indicates the minimum required film thickness for ensuring a desired level of the OFF-state current value of the transistor. On the other hand, the upper limit (2000 Å) of the film thickness indicates the maximum required film thickness for ensuring the desired level of the OFF-state current value of the transistor.

Next, amorphous silicon with impurity is formed under the following conditions:

power . . . 800 W
pressure . . . 180 Pa
film thickness . . . 200 to 1000 Å.

The lower limit (200 Å) of the film thickness of the amorphous silicon film without impurity indicates the minimum required film thickness for ensuring a desired level of the OFF-state current value of the transistor. On the other hand, the upper limit (1000 Å) for the film thickness indicates the maximum required film thickness for suppressing the manufacturing cost.

As described, the amorphous silicon film without impurity and the amorphous silicon film with impurity are patterned in a shape of island by the photolithography process and the etching process to be formed into an amorphous silicon film 17' without impurity and an amorphous silicon film 18' with impurity respectively.

Next, the processes illustrated in FIG. 4(c) will be explained.

On the amorphous silicon film 17' without impurity and the amorphous silicon film 18' with impurity patterned in a shape of island, a Ta film for use in forming the source electrode 15 and the drain electrode 19 is formed by the sputtering device under the following conditions:

power: 10 kw pressure: 0.7 Pa film thickness: not less than 100 Å.

Thereafter, using the dry etching device, the source/drain separated portion 21 is formed by continuously etching the Ta film and the amorphous silicon semiconductor film 18' with impurity without setting an etching selectivity ratio (both the Ta film and the amorphous silicon semiconductor film 18' are etched completely) under the following conditions:

$SF_6/O_2$ gas ratio . . . 1:1 pressure . . . 10 Pa power . . . 0.5 kw.

With the forgoing etching process of the Ta film and the amorphous silicon semiconductor film 18', the surface protrusions and recessions can be formed in the back channel region 17a on the order of several hundreds of Å RMS.

By the foregoing method, the amorphous silicon semiconductor layer 17 without impurity, the amorphous silicon semiconductor layer 18 with impurity, the source electrode 15 and the drain electrode 19 can be formed.

It should be noted here that the conditions for the formation of films and the etching adopted in the above preferred embodiment are optimal values for the film forming device and the etching device adopted by the applicant of the present application using conditions of the devices such a capacity of a chamber, etc. The present embodiment is therefore not intended to be limited to the above conditions, and the film forming conditions and the etching conditions can be adjusted to be suited for respective devices to be adopted.

Similarly, in the present embodiment, the source electrode 15 and the drain electrode 19 are formed from the Ta film. However, the metal film for use in forming these electrodes is not limited to the Ta film, and as explained in the above preferred embodiment, any metal which offers a bus resistance of a predetermined level can be adopted. Further, in the present embodiment, amorphous silicon is adopted for the semiconductor layer, however, polysilicon may be equally adopted as well.

Figure 6:
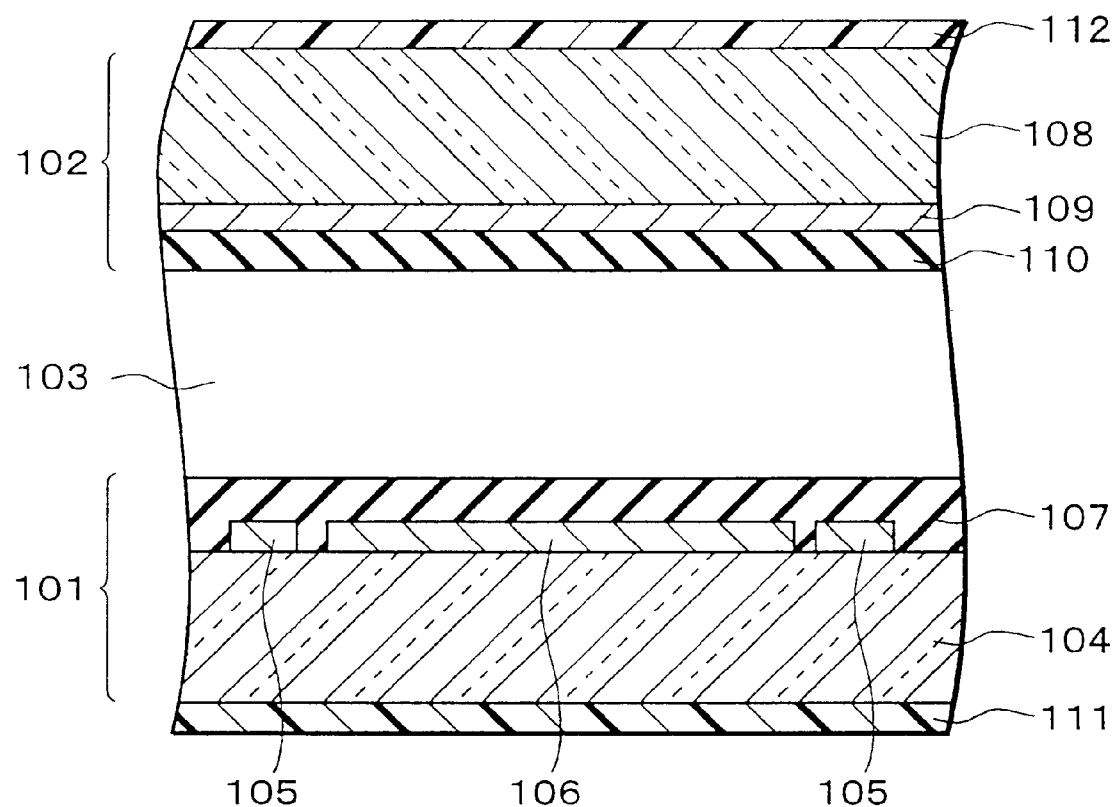
FIG. 6 is a cross-sectional view schematically illustrating the typical structure of the active-matrix-type liquid crystal display device adopting a TFT.
Figure 7:
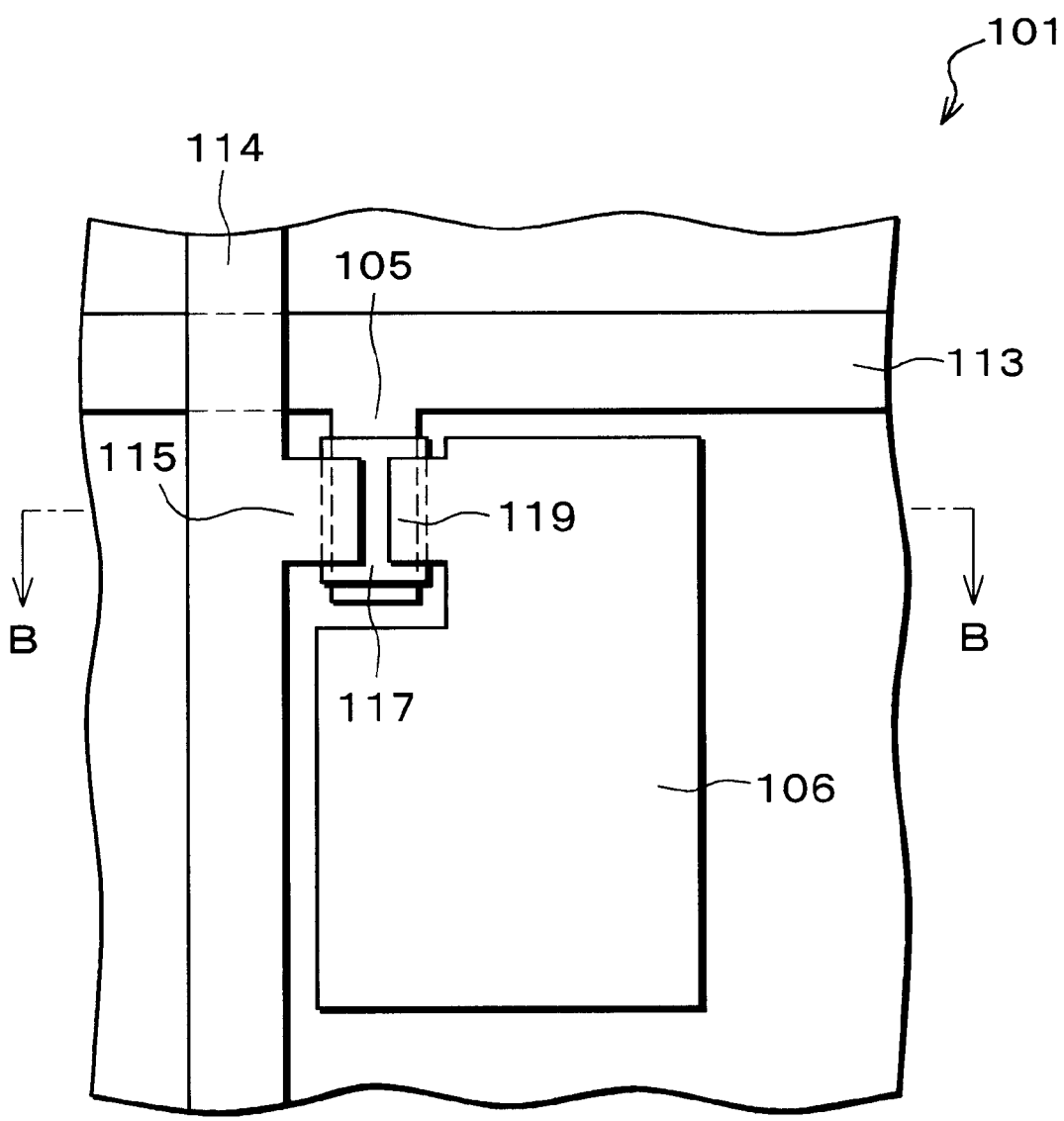
FIG. 7 is a plan view illustrating one pixel portion of a active-matrix-type liquid crystal display device adopting a conventional TFT.

The thin film transistor of the present embodiment is applicable, for example, to the active-matrix-type liquid crystal display device of FIG. 6. This active-matrix-type liquid crystal display device includes a TFT (Thin Film Transistor) substrate 101 for forming thereon TFTs and a counter substrate 102 which are connected so as to face one another, and liquid crystal 103 sealed in a space formed between the TFT substrate 101 and the counter substrate 102.

The TFT substrate 101 includes a transparent insulating substrate 104, and gate electrodes 105, source bus lines (not shown), TFTs (not shown) and pixel electrodes 106 connected to the TFTs which are formed in a matrix form on the surface of the transparent insulating substrate 104 on the side of the liquid crystal 103, and the TFT substrate 101 further includes an alignment film 107 formed so as to cover the entire surface of the transparent insulating substrate 104 including the above members. The surface of this alignment film 107 is rubbing processed.

On the other hand, the counter substrate 102 includes a transparent insulating substrate 108, and a transparent electrode 109 (counter electrode) and an alignment film 110 which are formed in this order on a color filter (not shown) disposed on the surface of the transparent insulating substrate 108 on the side of the liquid crystal 103. The surface of this alignment film 110 is rubbing processed.

As described, the thin film transistor of the present invention is arranged so as to include:

a gate electrode provided on a transparent insulating substrate;

a first semiconductor layer formed on the gate electrode via a gate insulating film; and a source electrode and a drain electrode formed on the first semiconductor layer via a second semiconductor layer which functions as a contact layer, wherein protrusions and recessions are formed in a separated portion between the source electrode and the drain electrode on a surface of the first semiconductor layer.

In the foregoing structure of the thin film transistor, it is preferable that the protrusions and recessions on the first semiconductor are formed in size within a range of from 100 Å to 900 Å RMS.

As described, by forming the protrusions and recessions on the surface of the first semiconductor layer in size of not less than 100 Å RMS, a still larger non-bonded area where bonds are cut can be formed in the back channel region. On the other hand, with the protrusions and recessions in size of not more than 900 Å RMS, adverse effects on the surface condition which possibly occur when laminating thereon another film can be prevented. Consequently, the number of uncombined bonds can be increased in the back channel region in the semiconductor element as final product. As a result, the number of defects in the back channel region increases which in turn increases the threshold value of the back channel.

Furthermore, by suppressing an increase in OFF-state current value, such problem that the final product becomes less reliable due to a reduction in contrast over a long time driving of a panel can be more surely prevented.

It is further preferable that the protrusions and recessions on the first semiconductor are formed in size within a range of from 200 Å to 800 Å RMS.

Furthermore, by forming the protrusions and recessions in size within a range of from 200 Å to 800 Å RMS, the following effects can be achieved. That is, with the protrusions and recessions in size of not less than 200 Å RMS, a still larger non-bonded area where bonds are cut can be achieved in the back channel region. On the other hand, with the protrusions and recessions in size of not more than 800 Å RMS, adverse effects on surface condition which possibly occur when laminating thereon another film can be more suppressed. Consequently, the number of uncombined bonds can be more increased in the back channel region in the semiconductor element as final product. As a result, the number of defects in the back channel region further increases which in turn further increases the threshold value of the back channel. It is therefore possible to obtain a still larger defect area in the back channel region in more desirable state as compared to the above structure having the protrusions and recessions in size within the range of from 100 Å to 900 Å RMS.

Furthermore, by suppressing an increase in OFF-state current value, such problem that the final product becomes less reliable due to a reduction in contrast over a long time driving of a panel can be more surely prevented.

It is further preferable that the protrusions and recessions in the separated portion between the source electrode and the drain electrode on the first semiconductor layer be formed by continuously etching the second semiconductor layer and a metal film for use in forming the source electrode and the drain electrode without setting the etching selectivity ratio (both the second semiconductor layer and the metal film are etched completely).

In the foregoing structure, by continuously etching the metal firm for use in forming the source electrode and the drain electrode and the source/drain separated portion of the second semiconductor layer, protrusions and recessions reflecting the crystal gain diameters of the metal film for use in forming the source electrode and the drain electrode can be formed on the surface of the first semiconductor layer between the source electrode and the drain electrode. These protrusions and recessions are formed by difference in etching rate within the metal film according the crystal concentration.

According to the foregoing structure, by forming the protrusions and recessions in the back channel region, a non-bonded area where bonds are cut can be increased, and the number of uncombined bonds is increased. Accordingly, defects in the back channel region increase, which in turn increase the threshold value of the back channel. Here, in the state an electric field induced by the externally applied positive ions due to the surface contamination of the protective film, etc., or by the positive charges of the protective film itself becomes not less than the threshold level, the OFF-state current value of the TFT increases. Therefore, an increase in the threshold value of the back channel as achieved from the foregoing structure of the present invention offers the effect of reducing an OFF-state current value.

By suppressing an increase in OFF-state current value, such problem that the final product becomes less reliable can be prevented.

In the formation of the protrusions and recessions on the surface of the semiconductor layer, by adopting the foregoing continuous etching, desirable protrusions and recessions can be formed with ease. Namely, these protrusions and recessions can be formed on the surface of the first semiconductor layer surface without requiring troublesome steps, i.e., increasing the manufacturing cost.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A thin film transistor, comprising:
   a gate electrode provided on a transparent insulating substrate;
   a first semiconductor layer formed on said gate electrode via a gate insulating film; and
   a source electrode and a drain electrode formed on said first semiconductor layer via a second semiconductor layer which functions as a contact layer,
   wherein protrusions and recessions are formed in a separated portion between said source electrode and said drain electrode on a surface of said first semiconductor layer, and
   wherein said protrusions and recessions on said first semiconductor are formed in size within a range of from 100 Å to 900 Å RMS.

2. The thin film transistor as set forth in claim 1, wherein:
   said protrusions and recessions on said first semiconductor are formed in size within a range of from 200 Å to 800 Å RMS.

3. The thin film transistor as set forth in claim 1, wherein:
   said protrusions and recessions in the separated portion between the source electrode and the drain electrode on said first semiconductor layer are formed by continuously etching said second semiconductor layer and a metal film for use in forming said source electrode and said drain electrode without setting an etching selectivity ratio.

4. The thin film transistor as set forth in claim 3, wherein:
   said protrusions and recessions are formed on said first semiconductor layer reflecting crystal grain diameters of the metal film for use in forming said source electrode and said drain electrode.

5. An active-matrix-type liquid crystal display device, comprising:
   pixel electrodes arranged in a matrix form;
   thin film transistors connected to said pixel electrodes, each thin film transistor including a gate electrode provided on a transparent insulating substrate, a first semiconductor layer formed on said gate electrode via a gate insulating film, and a source electrode and a drain electrode formed on said first semiconductor layer via a second semiconductor layer which functions as a contact layer, wherein protrusions and recessions are formed in a separate portion between said source electrode and said drain electrode on a surface of said first semiconductor layer; and
   a counter electrode provided so as to face said pixel electrodes with liquid crystal sealed in between,
   wherein said protrusions and recessions on said first semiconductor are formed in size within a range of from 100 Å to 900 Å RMS.

6. The active-matrix-type liquid crystal display device as set forth in claim 5, wherein:
   said protrusions and recessions in said first semiconductor are formed in size within a range of from 200 Å to 800 Å RMS.

7. The active-matrix-type liquid crystal display by device as set forth in claim 5, wherein:
   said protrusions and recessions in the separated portion between the source electrode and the drain electrode on said first semiconductor layer are formed by continuously etching said second semiconductor layer and a metal film for use in forming said source electrode and said drain electrode without setting an etching selectivity ratio.

8. The active-matrix-type liquid crystal display device as set forth in claim 7, wherein:
   said protrusions and recessions are formed on said first semiconductor layer reflecting crystal grain diameters of the metal film for use in forming said source electrode and said drain electrode.

* * * * *